(12) United States Patent
Park et al.

(10) Patent No.: US 10,121,769 B2
(45) Date of Patent: Nov. 6, 2018

(54) FAN-OUT SEMICONDUCTOR PACKAGE

(71) Applicant: Samsung Electro-Mechanics, Co., Ltd., Suwon-si, Gyeonggi-do (KR)

(72) Inventors: Dae Hyun Park, Suwon-si (KR); Eun Jung Jo, Suwon-si (KR); Sung Won Jeong, Suwon-si (KR); Han Kim, Suwon-si (KR); Mi Ja Han, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/437,766

(22) Filed: Feb. 21, 2017

(65) Prior Publication Data

US 2018/0076178 A1    Mar. 15, 2018

(30) Foreign Application Priority Data

Sep. 12, 2016   (KR) ........................ 10-2016-0117476

(51) Int. Cl.
  *H01L 23/02*   (2006.01)
  *H01L 25/065*  (2006.01)
  (Continued)

(52) U.S. Cl.
  CPC ...... *H01L 25/0657* (2013.01); *H01L 23/3157* (2013.01); *H01L 24/02* (2013.01);
  (Continued)

(58) Field of Classification Search
  CPC ........... H01L 21/96; H01L 2224/16145; H01L 2225/06548; H01L 2224/96;
  (Continued)

(56) References Cited

U.S. PATENT DOCUMENTS

| 7,550,857 B1 | 6/2009 | Longo et al. |
| 2005/0205979 A1 | 9/2005 | Shin et al. |

(Continued)

FOREIGN PATENT DOCUMENTS

| KR | 10-2013-0015393 A | 2/2013 |
| KR | 10-1362396 B1 | 2/2014 |

OTHER PUBLICATIONS

Taiwanese Office Action issued in corresponding Taiwanese Patent Application No. 106105819, dated May 21, 2018, with English Translation.
Non-Final Office Action issued in related U.S. Appl. No. 15/951,571, dated Sep. 21, 2018.

*Primary Examiner* — S. V. Clark
(74) *Attorney, Agent, or Firm* — McDermott Will & Emery LLP

(57) ABSTRACT

A fan-out semiconductor package includes: a first interconnection member having a through-hole; a first semiconductor chip disposed in the through-hole and having an active surface having connection pads disposed thereon and an inactive surface; a first encapsulant encapsulating at least portions of the first interconnection member and the first semiconductor chip; a second interconnection member disposed on the first interconnection member and the first semiconductor chip; a second semiconductor chip disposed on the first encapsulant and having an active surface having connection pads disposed thereon; and a second encapsulant encapsulating at least portions of the second semiconductor chip. The first interconnection member and the second interconnection member include, respectively, redistribution layers electrically connected to the connection pads of the first semiconductor chip, and the connection pads of the second semiconductor chip are electrically connected to the redistribution layer of the first interconnection member by wires.

15 Claims, 10 Drawing Sheets

(51) Int. Cl.
    *H01L 23/00* (2006.01)
    *H01L 23/31* (2006.01)
(52) U.S. Cl.
    CPC .............. *H01L 24/09* (2013.01); *H01L 24/49* (2013.01); *H01L 2224/02372* (2013.01); *H01L 2224/02373* (2013.01); *H01L 2224/02379* (2013.01); *H01L 2225/0651* (2013.01); *H01L 2225/06548* (2013.01); *H01L 2225/06582* (2013.01)
(58) Field of Classification Search
    CPC ....... H01L 25/0657; H01L 2224/04105; H01L 2224/32145; H01L 2921/181
    USPC .......................................... 257/686, 777, 787
    See application file for complete search history.

(56) References Cited

U.S. PATENT DOCUMENTS

| | | |
|---|---|---|
| 2009/0236686 A1 | 9/2009 | Shim et al. |
| 2010/0140771 A1* | 6/2010 | Huang ................ H01L 21/6835 257/686 |
| 2013/0341784 A1 | 12/2013 | Lin et al. |
| 2014/0217610 A1 | 8/2014 | Jeng et al. |
| 2015/0179616 A1* | 6/2015 | Lin ......................... H01L 25/50 257/773 |
| 2016/0190107 A1* | 6/2016 | Meyer .................... H01L 23/31 257/686 |
| 2016/0276311 A1* | 9/2016 | Meyer ................... H01L 21/568 |
| 2017/0373010 A1* | 12/2017 | Lee ..................... H01L 23/5386 |
| 2018/0108644 A1 | 4/2018 | Kim et al. |

* cited by examiner

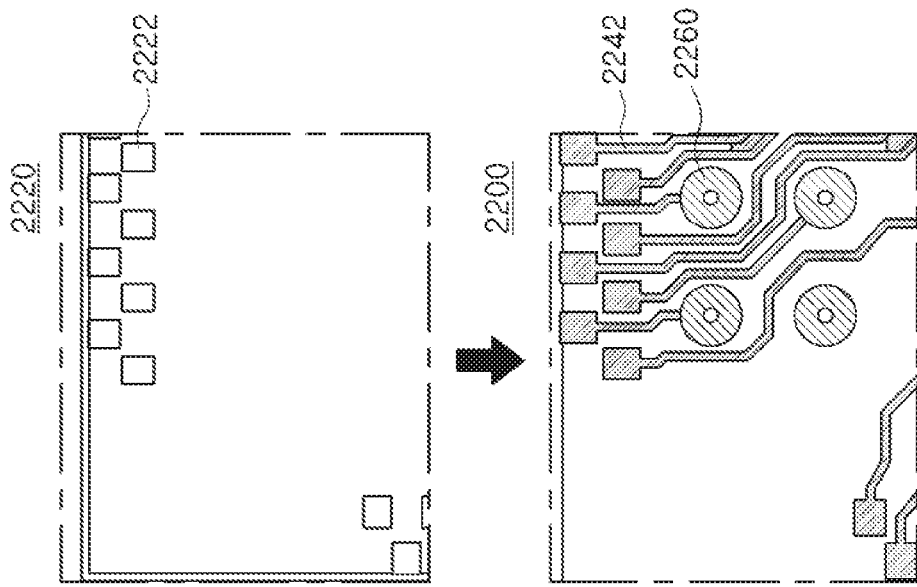
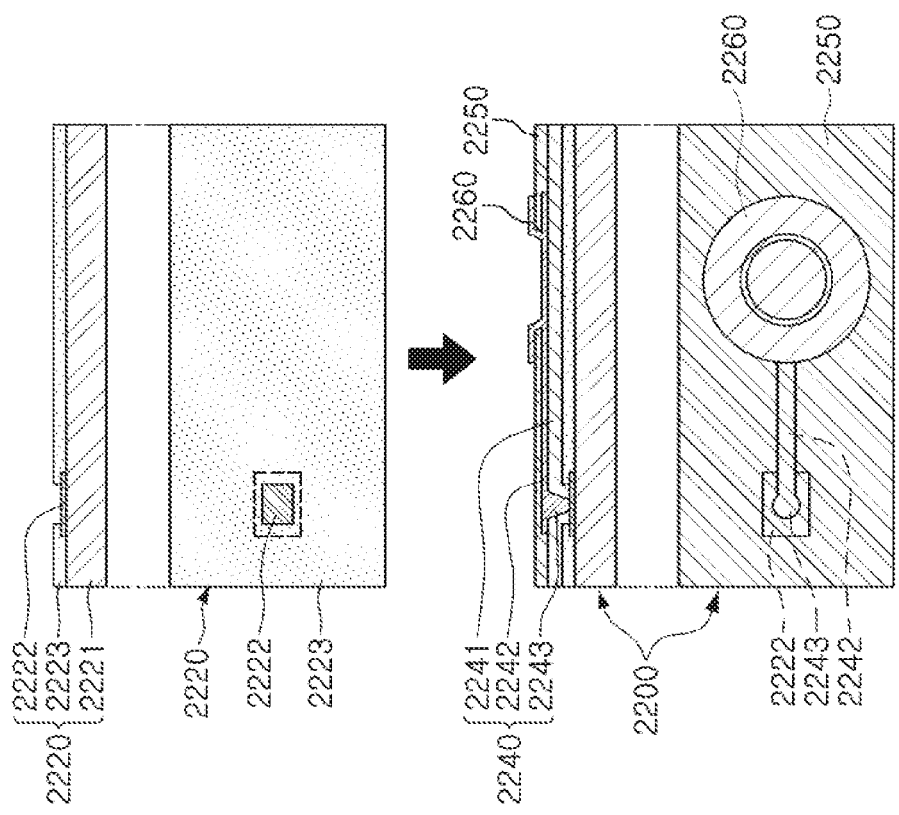
FIG. 3B
FIG. 3A

FAN-OUT SEMICONDUCTOR PACKAGE

CROSS-REFERENCE TO RELATED APPLICATION(S)

This application claims the benefit of priority to Korean Patent Application No. 10-2016-0117476 filed on Sep. 12, 2016 in the Korean Intellectual Property Office, the entire disclosure of which is incorporated herein by reference.

BACKGROUND

1. Technical Field

The present disclosure relates to a semiconductor package, and more particularly, to a fan-out semiconductor package in which connection terminals may be extended outwardly of a region in which a semiconductor chip is disposed.

2. Description of Related Art

Recently, a significant recent trend in the development of semiconductor chip-related technology has been reducing the size of semiconductor chips. Therefore, in the area of package technology, in accordance with a rapid increase in demand for small-sized semiconductor chips, or the like, there has been increased demand for the implementation of a semiconductor package having a compact size while including a plurality of pins.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of simultaneously performing various functions, being thinned, and having low signal loss.

One of several solutions suggested in the present disclosure is to dispose a second semiconductor chip on a first semiconductor chip package without using a separate interposer and connect the second semiconductor chip to redistribution layers of interconnection members of the first semiconductor chip package using wires to redistribute connection pads of the second semiconductor chip.

According to an aspect of the present disclosure, a fan-out semiconductor package may include: a first interconnection member having a through-hole; a first semiconductor chip disposed in the through-hole of the first interconnection member and having an active surface having connection pads disposed thereon and an inactive surface opposing the active surface; a first encapsulant encapsulating at least portions of the first interconnection member and the inactive surface of the first semiconductor chip; a second interconnection member disposed on the first interconnection member and the active surface of the first semiconductor chip; a second semiconductor chip disposed on the first encapsulant and having an active surface having connection pads disposed thereon; and a second encapsulant encapsulating at least portions of the second semiconductor chip, wherein the first interconnection member and the second interconnection member include, respectively, redistribution layers electrically connected to the connection pads of the first semiconductor chip, and the connection pads of the second semiconductor chip are electrically connected to the redistribution layer of the first interconnection member by wires.

BRIEF DESCRIPTION OF THE DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the lower direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
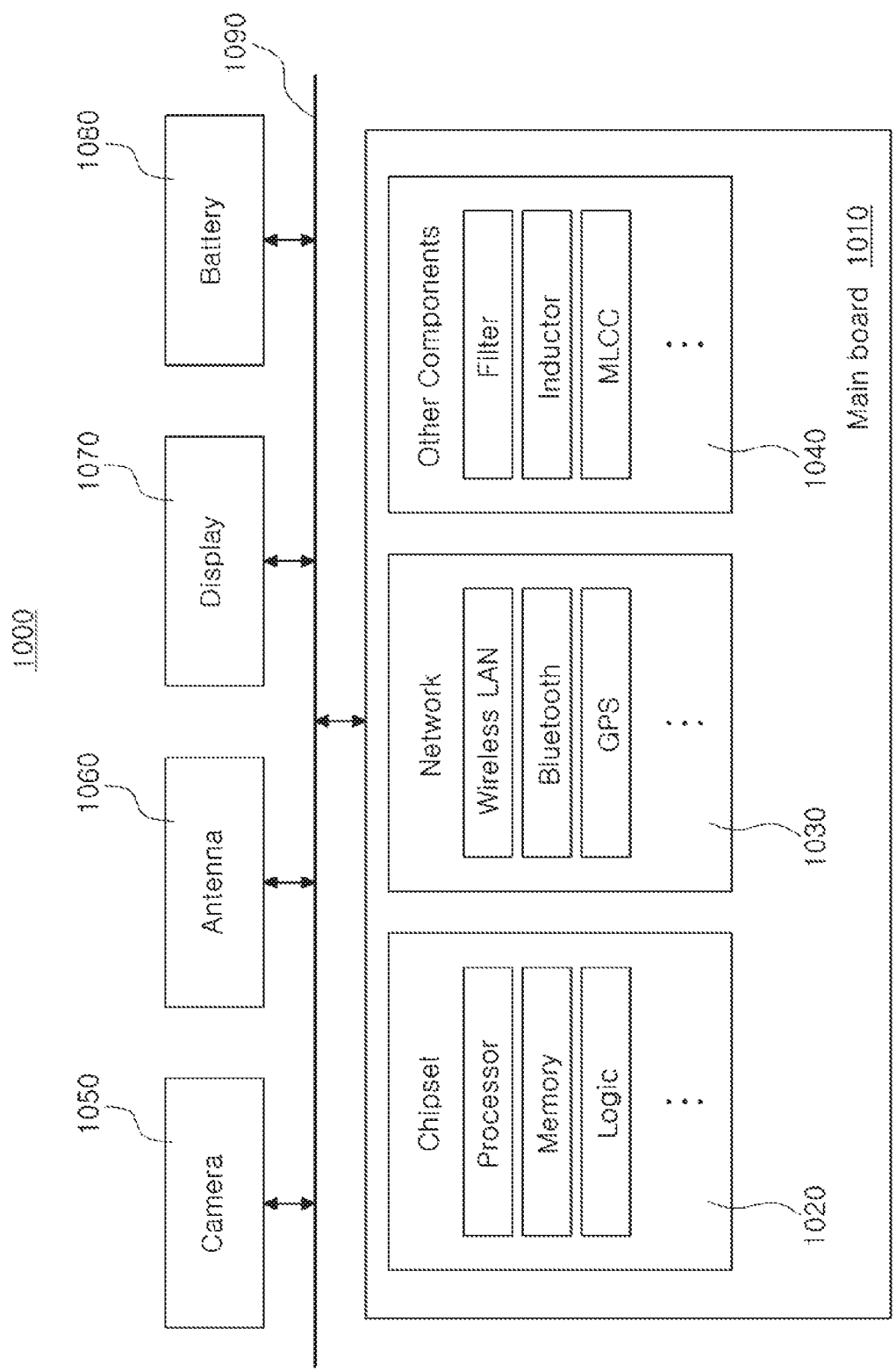
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010. The main board 1010 may include chip-related components 1020, network-related components 1030, other components 1040, and the like, physically or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may include passive components used for various other purposes, or the like. In addition, other components 1040 may be combined with each other, together with the chip-related components 1020 or the network-related components 1030 described above.

Depending on type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may include other components used for various purposes depending on type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
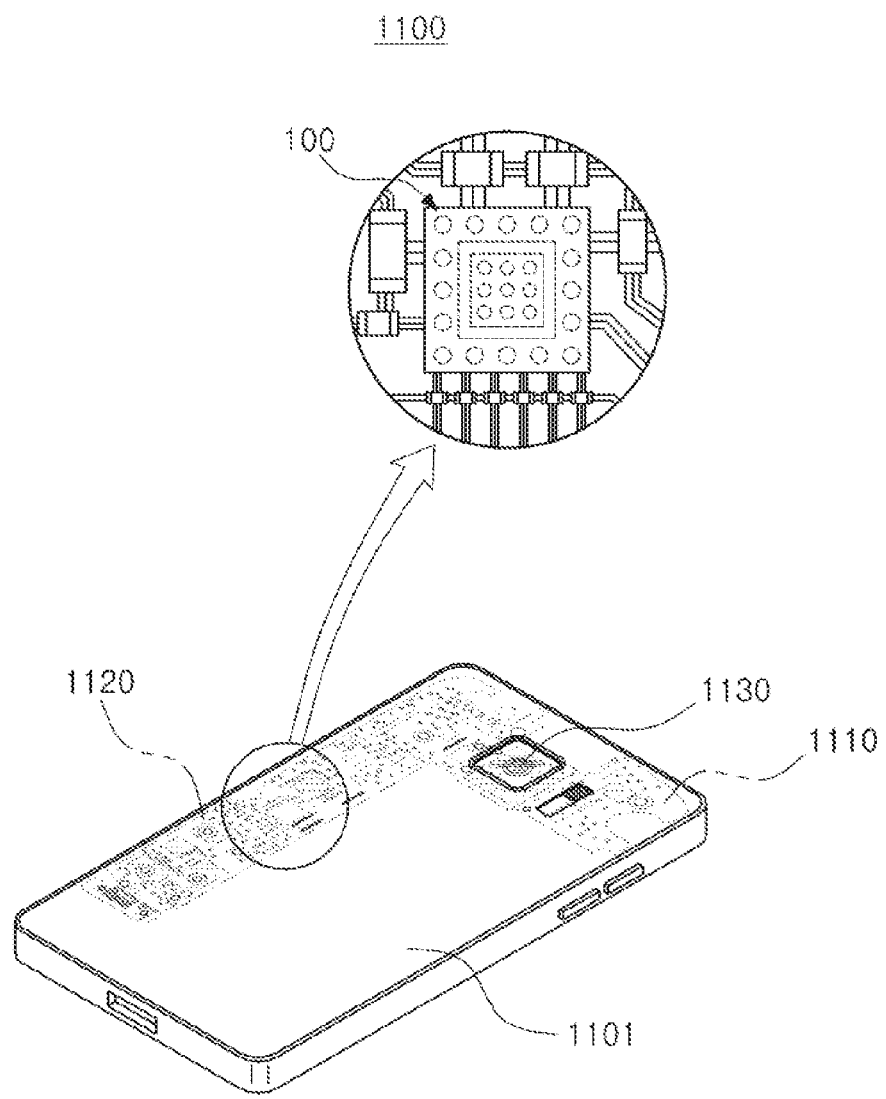
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip is not used itself, but is packaged and used in an electronic device, or the like, in a package state.

Semiconductor packaging is required due to a difference in a circuit width existing between the semiconductor chip and a main board of the electronic device with regard to electrical connectivity. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured using packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
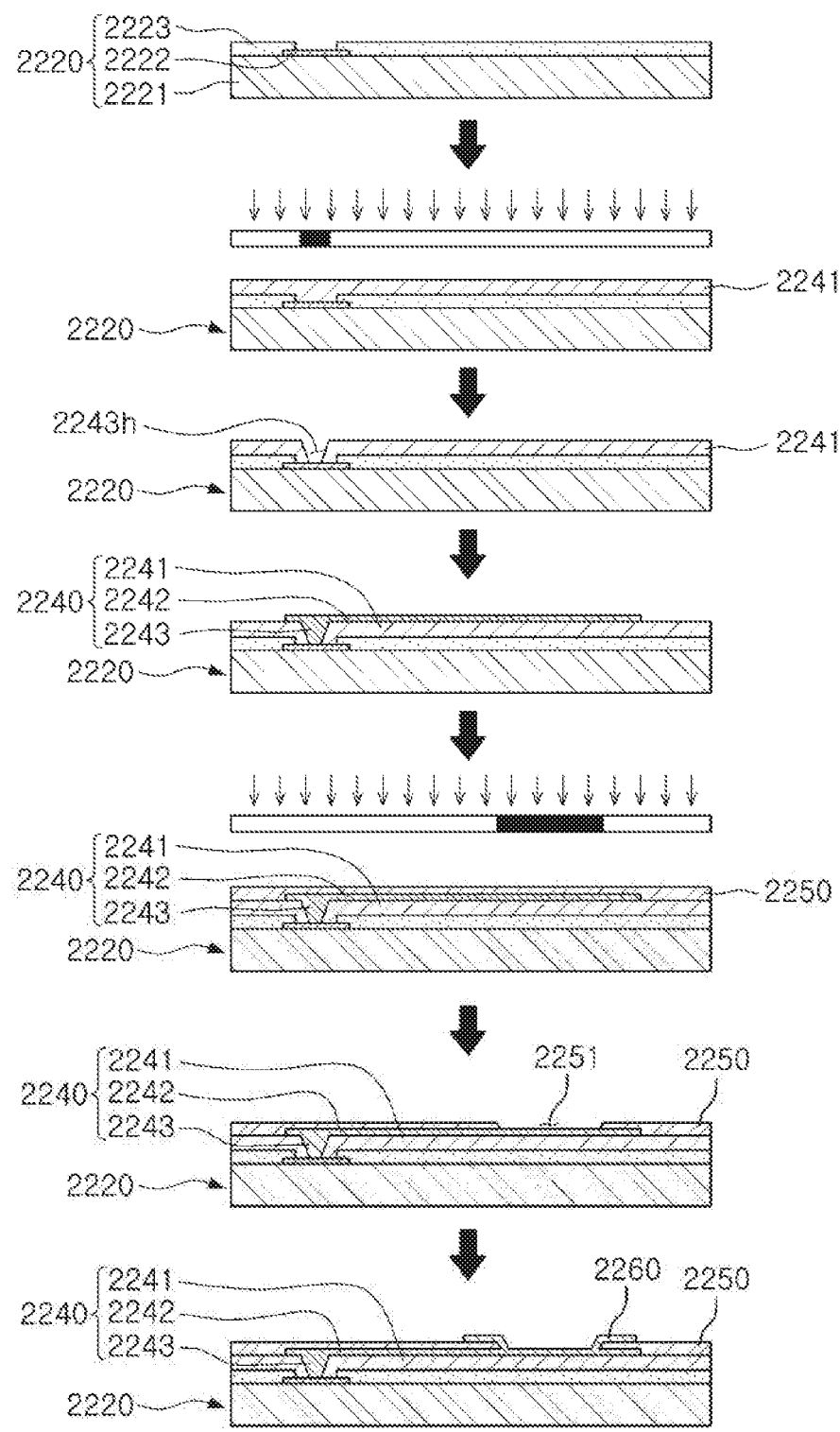
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, depending on a size of the semiconductor chip 2220, a interconnection member 2240 may be formed on the semiconductor chip 2220 in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an underbump metal layer 2260, or the like, may be formed. That is, a fan-in semiconductor package 2200 including, for example, the semiconductor chip 2220, the interconnection member 2240, the passivation layer 2250, and the underbump metal layer 2260 may be manufactured through a series of processes.

As described above, the fan-in semiconductor package may have a package form in which all of the connection pads of the semiconductor chip, input/output (I/O) terminals for example, are disposed inside the semiconductor chip, may have excellent electrical characteristics and may be produced at low cost. Therefore, many elements mounted in a smartphone have been manufactured in fan-in semiconductor package form. In detail, many elements mounted in the smartphone have been developed to allow for rapid signal transfer while having a compact size.

However, since all of the I/O terminals need to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
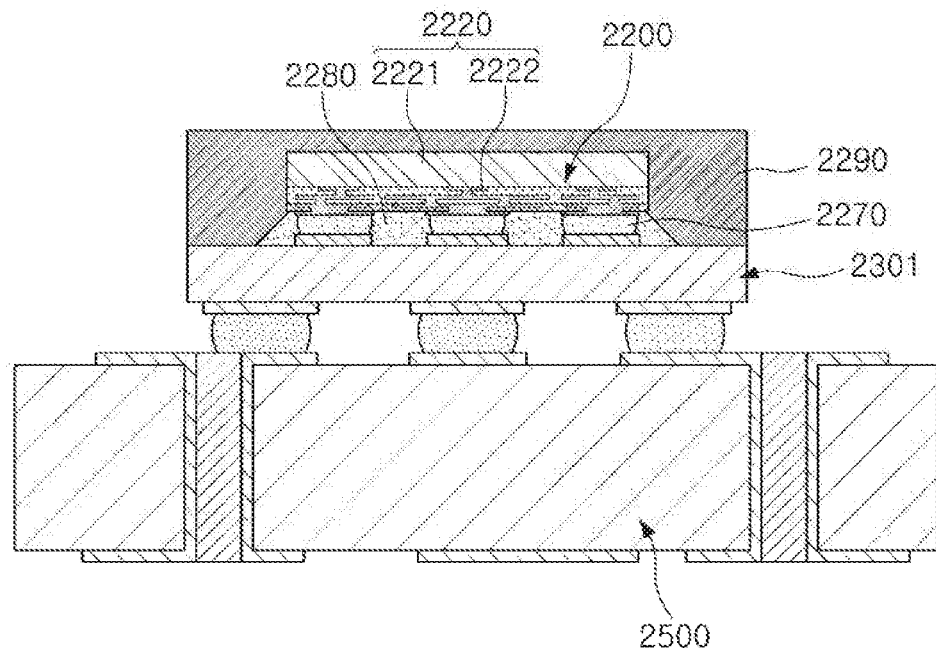
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
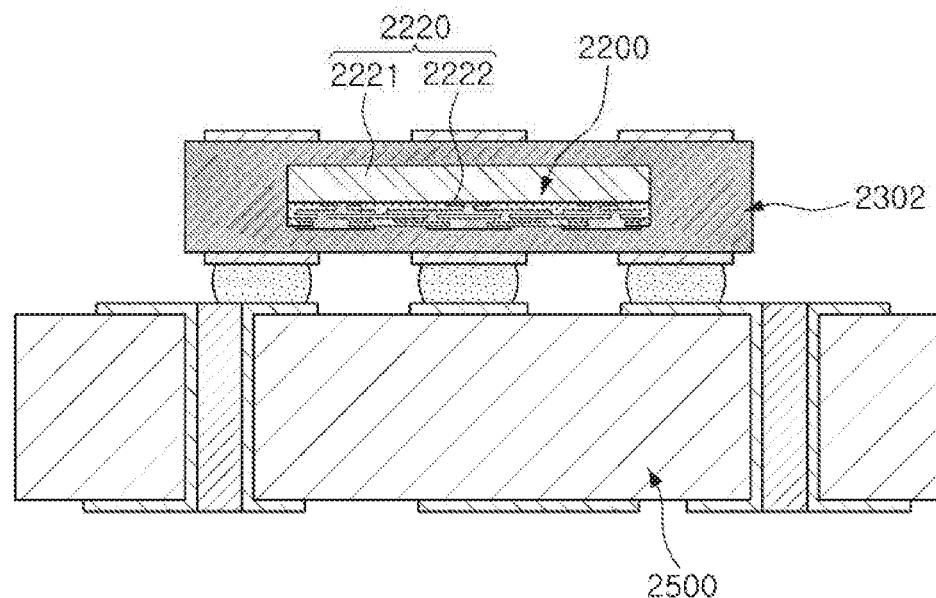
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. Here, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and may then be mounted on the main board of the electronic device through a packaging process or may be mounted and used on the main board of the electronic device in a state in which it is embedded in the interposer substrate.

Fan-Out Semiconductor Package

Figure 7:
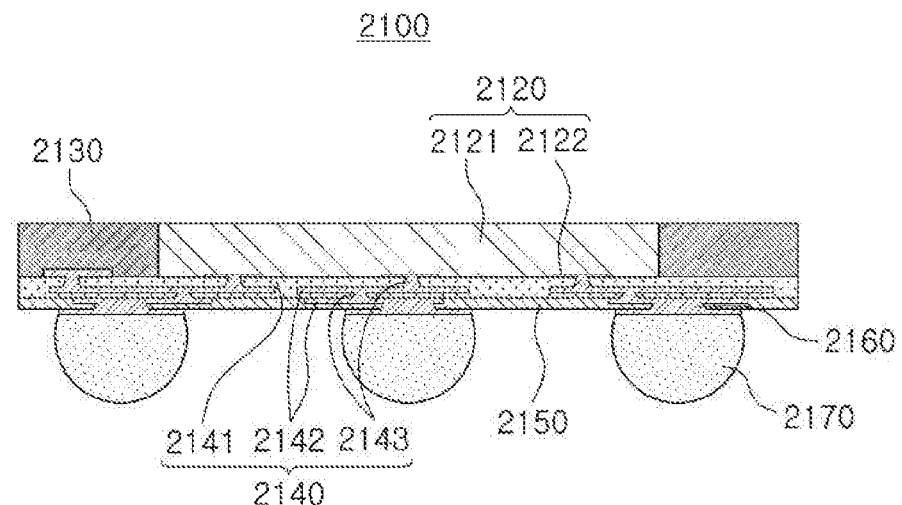
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
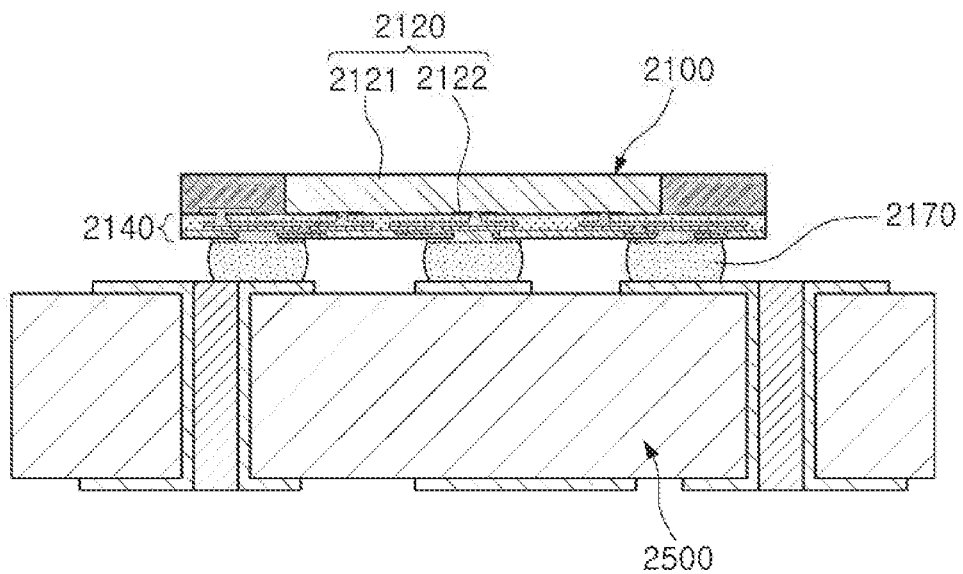
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and which is conceptually different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of simultaneously performing various functions, being thinned, and having low signal loss will hereinafter be described with reference to the drawings.

Figure 9:
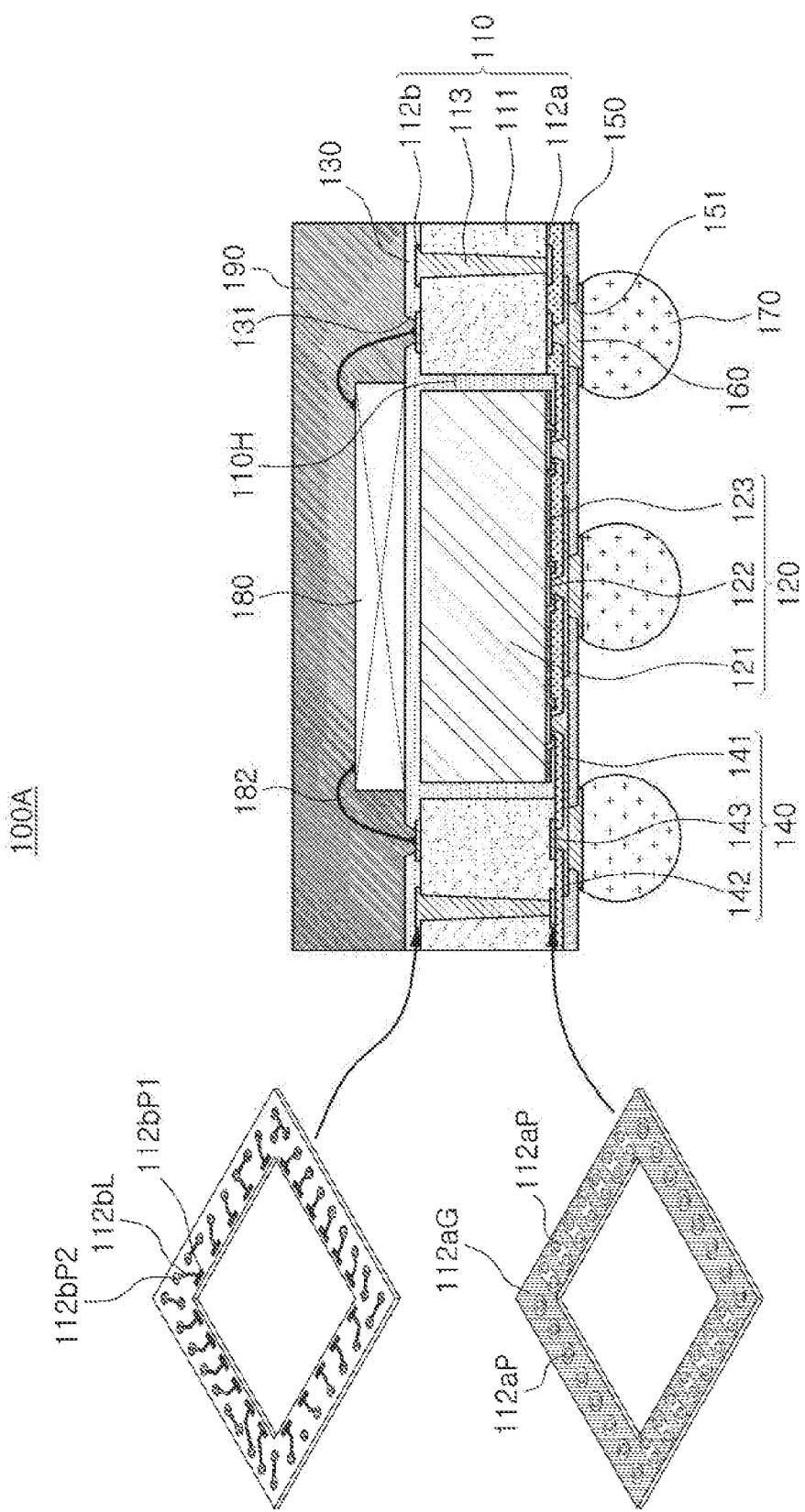
FIG. 9 is a schematic view illustrating an example of a fan-out semiconductor package.

FIG. 9 is a schematic view illustrating an example of a fan-out semiconductor package.

Referring to the drawings, a fan-out semiconductor package 100A according to an exemplary embodiment in the present disclosure may include a first interconnection member 110 having a through-hole 110H, a first semiconductor chip 120 disposed in the through-hole 110H of the first interconnection member 110 and having an active surface having connection pads 122 disposed thereon and an inactive surface opposing the active surface, a first encapsulant 130 encapsulating at least portions of the first interconnection member 110 and the inactive surface of the first semiconductor chip 120, a second interconnection member 140 disposed on the first interconnection member 110 and the active surface of the first semiconductor chip 120, a second semiconductor chip 180 disposed on the first encapsulant 130 and having an active surface having connection pads (not illustrated) disposed thereon, and a second encapsulant 190 encapsulating at least portions of the second semiconductor chip 180. The first interconnection member 110 and the second interconnection member 140 may include, respectively, redistribution layers 112a and 112b and 142 electrically connected to the connection pads 122 of the first semiconductor chip 120, and the connection pads (not illustrated) of the second semiconductor chip 180 may be electrically connected to the redistribution layers 112a and 112b of the first interconnection member 110 by wires 182. The fan-out semiconductor package 100A according to the exemplary embodiment may further include a passivation layer 150 disposed on the second interconnection member 140, an underbump metal layer 160 disposed on openings 151 of the passivation layer 150, and connection terminals 170 disposed on the underbump metal layer 160.

In general, a package-on-package (POP) type package may be used as a method of implementing multiple functions, such as those of a processor and a memory. The POP type package may be manufactured by, for example, a method of packaging a processor chip as a lower package in a wafer level package form, mounting and packaging a memory chip as an upper package on an interposer, and stacking the upper package on the lower package using a solder ball. However, in this case, the entire package is configured by separately manufacturing the lower package and the upper package and then stacking the upper package on the lower package. Therefore, there is a limitation in reducing a thickness of the entire package and loss may be generated in signal characteristics between the lower package and the upper package.

On the other hand, in the fan-out semiconductor package 100A according to the exemplary embodiment, the first interconnection member 110 having the redistribution layers 112a and 112b may be disposed in an encapsulation region of the first semiconductor chip 120, and the second semiconductor chip 180 may be electrically connected to the redistribution layers 112a and 112b of the first interconnection member 110 using the wires 182, such that the connection pads (not illustrated) of the second semiconductor chip 180 may be sufficiently redistributed without using a separate interposer. Therefore, a thickness of the entire fan-out semiconductor package 100A may be significantly reduced. In addition, a signal transfer path between the first semiconductor chip 120 and the second semiconductor chip 180 may be significantly reduced, such that signal loss may be significantly reduced.

Meanwhile, the first semiconductor chip 120 may include a processor chip, and the second semiconductor chip 180 may include a memory chip. As described above, the processor chip and the memory chip that need to communicate with each other may be disposed in one fan-out semiconductor package 100A and may be electrically connected to each other, such that the fan-out semiconductor package 100A having various functions may be implemented.

The respective components included in the fan-out semiconductor package 100A according to the exemplary embodiment will hereinafter be described in more detail.

The first interconnection member 110 may include the redistribution layers 112a and 112b redistributing the connection pads 122 of the first semiconductor chip 120 and the connection pads (not illustrated) of the second semiconductor chip 180 to thus reduce the number of layers of the second interconnection member 140. The first interconnection member 110 may maintain rigidity of the fan-out semiconductor package 100A depending on certain materials, and serve to secure uniformity of a thickness of the first encapsulant 130. The fan-out semiconductor package 100A according to the exemplary embodiment may be utilized as a POP type package by the first interconnection member 110. The first interconnection member 110 may have the through-hole 110H. The through-hole 110H may have the first semiconductor chip 120 disposed therein to be spaced apart from the first interconnection member 110 by a predetermined distance. Side surfaces of the first semiconductor chip 120 may be surrounded by the first interconnection member 110. However, such a form is only an example and may be variously modified into other forms, and the fan-out semiconductor package 100A may perform another function depending on such a form.

The first interconnection member 110 may include an insulating layer 111 contacting the second interconnection member 140, a first redistribution layer 112a contacting the second interconnection member 140 and embedded in a first surface of the insulating layer 111, and a second redistribution layer 112b disposed on a second surface of the insulating layer 111 opposing the first surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122 of the first semiconductor chip 120 and the connection pads (not illustrated) of the second semiconductor chip 180. When the first redistribution layer 112a is embedded in the insulating layer 111, a step generated due to a thickness of the first redistribution layer 112a may be significantly reduced, and an insulating distance of the second interconnection member 140 may thus become constant. That is, a difference between a distance from the redistribution layer 142 of the second interconnection member 140 to a lower surface of the insulating layer 111 and a distance from the redistribution layer 142 of the second interconnection member 140 to the connection pad 122 of the first semiconductor chip 120 may be smaller than a thickness of the first redistribution layer 112a. Therefore, a high density wiring design of the second interconnection member 140 may be facilitated.

A material of the insulating layer 111 is not particularly limited. For example, an insulating material may be used as the material of the insulating layer 111. In this case, a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like, may be used as the insulating material. Alternatively, a photoimagable dielectric (PID) resin may also be used as the insulating material.

The redistribution layers 112a and 112b may serve to redistribute the connection pads 122 of the first semiconductor chip 120 and the connection pads (not illustrated) of the second semiconductor chip 180, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a and 112b. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, wire pads, connection terminal pads, and the like.

As a non-restrictive example, the second redistribution layer 112b may include wire pads 112bP1 connected to the wires, and wiring patterns 112bL and 112bP2 such as signal, power, ground lines 112bL or pads 112bP2, or the like, connected to the wire pads 112bP1 and at least redistributing the connection pads (not illustrated) of the second semiconductor chip 180. In addition, the first redistribution layer 112a may include wiring patterns 112aP and 112aG such as signal, power, ground pads 112aP or plane 112aG, or the like, electrically connected to the second redistribution layer 112b through the vias 113 and at least redistributing the connection pads (not illustrated) of the second semiconductor chip 180. Meanwhile, the connection pads 122 of the first semiconductor chip 120 may also be redistributed through these wiring patterns.

Portions of the second redistribution layer 112b may be exposed through openings 131 formed in the first encapsulant 130, and the exposed second redistribution layer 112b may be connected to the wires 182. That is, the exposed second redistribution layer 112b may include the wire pads 112bP1 connected to the wires. Meanwhile, a surface treatment layer (not illustrated) may be formed on a surface of the exposed second redistribution layer 112b, if necessary. The surface treatment layer (not illustrated) is not particularly limited as long as it is known in the related art, and may be formed by using, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers, resulting in an electrical path in the first interconnection member 110. A conductive material may also be used as a material of each of the vias 113. The via 113 may be entirely filled with the conductive material, or the conductive material may be formed along a wall of a via hole. In addition, each of the vias 113 may have all of the shapes known in the related art, such as a tapered shape, a cylindrical shape, and the like. Meanwhile, when holes for the vias 113 are formed, some of the pads of the first redistribution layer 112a may serve as a stopper, and it may be thus advantageous in a process that each of the vias 113 has the tapered shape of which a width of an upper surface is greater than that of a lower surface. In this case, the vias 113 may be integrated with the pad patterns of the second redistribution layer 112b.

The first semiconductor chip 120 may be an application specific integrated circuit (ASIC) provided in an amount of several hundreds to several millions of elements or more integrated in a single chip. In this case, the ASIC may be, for example, a processor chip (more specifically, an application processor (AP)) such as a central processor (for example, a CPU), a graphics processor (for example, a GPU), a field programmable gate array (FPGA), a digital signal processor, a cryptographic processor, a microprocessor, a microcontroller, or the like, but is not limited thereto. The first semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the first semiconductor chip 120 to other components, and a conductive material such as aluminum (Al), or the like, may be used as a material of each of the connection pads 122. A passivation layer 123 exposing the connection pads 122 may be formed on the body 121, and may be an oxide film, a nitride film, or the like, or a double layer including an oxide film and a nitride film. A lower surface of the connection pad 122 may have a step with respect to a lower surface of the first encapsulant 130 through the passivation layer 123. Resultantly, a phenomenon in which the first encapsulant 130 is bled to the lower surface of the connection pad 122 may be prevented to some degree. An insulating layer (not illustrated), and the like, may also be further disposed at other required positions.

The first encapsulant 130 may protect the first interconnection member 110, the first semiconductor chip 120, and the like. An encapsulation form of the first encapsulant 130 is not particularly limited, but may be a form in which the first encapsulant 130 surrounds at least portions of the first interconnection member 110, the first semiconductor chip 120, and the like. For example, the first encapsulant 130 may cover the first interconnection member 110 and the inactive surface of the first semiconductor chip 120, and fill spaces between walls of the through-hole 110H and the side surfaces of the first semiconductor chip 120. In addition, the first encapsulant 130 may also fill at least a portion of a space between the passivation layer 123 of the first semiconductor chip 120 and the second interconnection member 140. The first encapsulant 130 may fill the through-hole 110H to thus serve as an adhesive and reduce buckling of the first semiconductor chip 120 depending on certain materials.

The certain materials of the first encapsulant 130 are not particularly limited. For example, an insulating material may be used as the material of the first encapsulant 130. In this case, a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like, may be used as the insulating material. Alternatively, EMC, PID, or the like, may be used. Alternatively, a material in which a thermosetting resin or a thermoplastic resin is impregnated together with an inorganic filler in a core material such as a glass cloth (or a glass fabric) may also be used as the insulating material.

The second interconnection member 140 may redistribute the connection pads 122 of the first semiconductor chip 120 and the connection pads (not illustrated) of the second semiconductor chip 180, and electrically connect the connection pads 122 of the first semiconductor chip 120 and the connection pads (not illustrated) of the second semiconductor chip 180 to each other. Several tens to several hundreds of connection pads 122 having various functions may be redistributed by the second interconnection member 140, and may be physically or electrically connected to an external source through the connection terminals 170 depending on the functions. The second interconnection member 140 may include insulating layers 141, redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, but may also include a plurality of layers.

An insulating material may be used as a material of the insulating layers 141. In this case, in addition to the insulating material as described above, a photosensitive insulating material such as a PID resin may also be used as the insulating material. That is, the insulating layer 141 may be a photosensitive insulating layer. In a case in which the insulating layer 141 has a photosensitive property, the insulating layer 141 may be formed to have a smaller thickness, and a fine pitch of the vias 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other. When the insulating layers 141 are multiple layers, the insulating layers 141 may be integrated with each other depending on a process, such that boundaries therebetween may not be readily apparent.

The redistribution layers 142 may substantially serve to redistribute the connection pads 122, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142. The redistribution layers 142 may perform various functions depending on designs of their corresponding layers. For example, the redistribution layers 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

A surface treatment layer (not illustrated) may be formed on a surface of the exposed redistribution layer 142, if necessary. The surface treatment layer may be formed by, for example, electrolytic gold plating, electroless gold plating, OSP or electroless tin plating, electroless silver plating, electroless nickel plating/substituted gold plating, DIG plating, HASL, or the like, but is not limited thereto.

The vias 143 may electrically connect the redistribution layers 142, the connection pads 122, or the like, formed on different layers, resulting in an electrical path in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the vias 143. The vias 143 may be entirely filled with the conductive material, or the conductive material may also be formed along a wall of the via. In addition, the vias 143 may have all of the shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the first semiconductor chip 120, the redistribution layers 112a and 112b formed in the first interconnection member 110 may be formed to be relatively large, depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may additionally be configured to protect the second interconnection member 140 from external physical or chemical damage. The passivation layer 150 may have the openings 151 exposing at least portions of the redistribution layer 142 of the second interconnection member 140. The number of openings 151 formed in the passivation layer 150 may be several tens to several thousands.

A material having an elastic modulus greater than that of the insulating layer 141 of the second interconnection member 140 may be used as a material of the passivation layer 150. For example, ABF that does not include a glass cloth (or a glass fabric), but includes an inorganic filler and an insulating resin, or the like, may be used as the material of the passivation layer 150. When the ABF, or the like, is used as the material of the passivation layer 150, a weight percent of the inorganic filler included in the passivation layer 150 may be greater than that of the inorganic filler included in the insulating layer 141 of the second interconnection member 140. In this condition, reliability may be improved. When the ABF, or the like, is used as the material of the passivation layer 150, the passivation layer 150 may be a non-photosensitive insulating layer including the inorganic filler, and may be effective in improving reliability, but is not limited thereto.

An underbump metal layer 160 may additionally be configured to improve connection reliability of the connection terminals 170 and improve board level reliability of the fan-out semiconductor package 100A. The underbump metal layer 160 may be connected to the redistribution layer 142 of the second interconnection member 140 exposed through the openings 151 of the passivation layer 150. The underbump metal layer 160 may be formed in the openings 151 of the passivation layer 150 by the known metallization method using the known conductive metal such as a metal, but is not limited thereto.

The connection terminals 170 may additionally be configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material such as a solder, or the like. However, this is only an example, and a material of each of the connection terminals 170 is not limited thereto.

Each of the connection terminals 170 may be a land, a ball, a pin, or the like. The connection terminal 170 may be formed of multiple layers or a single layer. When the connection terminals 170 are formed of multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto.

The number, an interval, a disposition form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, but are not limited thereto, and may also be provided in an amount of several tens to several thousands or more or several tens to several thousands or less. When the connection terminals 170 are solder balls, the connection terminals 170 may cover side surfaces of the underbump metal layer 160 extended onto one surface of the passivation layer 150, and connection reliability may be more excellent.

At least one of the connection terminals 170 may be disposed in a fan-out region. The fan-out region is a region except for the region in which the first semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The second semiconductor chip 180 may also be an integrated circuit (IC) provided in an amount of several hundreds to several millions of elements or more integrated in a single chip. In this case, the IC may be a memory chip such as a volatile memory (for example, a dynamic random access memory (DRAM)), a non-volatile memory (for example, a read only memory (ROM)), a flash memory, or the like. The second semiconductor chip 180 may have an active surface having the connection pads (not illustrated) thereon and an inactive surface disposed to oppose the active surface. The second semiconductor chip 180 may be disposed so that the inactive surface thereof faces the first encapsulant 130. The connection pads (not illustrated) may be electrically connected to the redistribution layers 112a and 112b of the first interconnection member 110 through the wires 182. The wires 182 may be a known metal wire such as a gold wire, but is not limited thereto. The second semiconductor chip 180 may also be formed by stacking a plurality of memory chips.

The second encapsulant 190 may protect the second semiconductor chip 180. An encapsulation form of the second encapsulant 190 is not particularly limited, but may be a form in which the second encapsulant 190 surrounds at least portions of the second semiconductor chip 180, and the like. For example, the second encapsulant 190 may cover the inactive surface of the second semiconductor chip 180, and may cover side surfaces of the second semiconductor chip 180. Certain materials of the second encapsulant 190 are not particularly limited. For example, an insulating material may be used as the material of the second encapsulant 190. In this case, a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like, may be used as the insulating material. Alternatively, EMC, PID, or the like, may be used. Alternatively, a material in which a thermosetting resin or a thermoplastic resin is impregnated together with an inorganic filler in a core material such as a glass cloth (or a glass fabric) may also be used as the insulating material.

Figure 10:
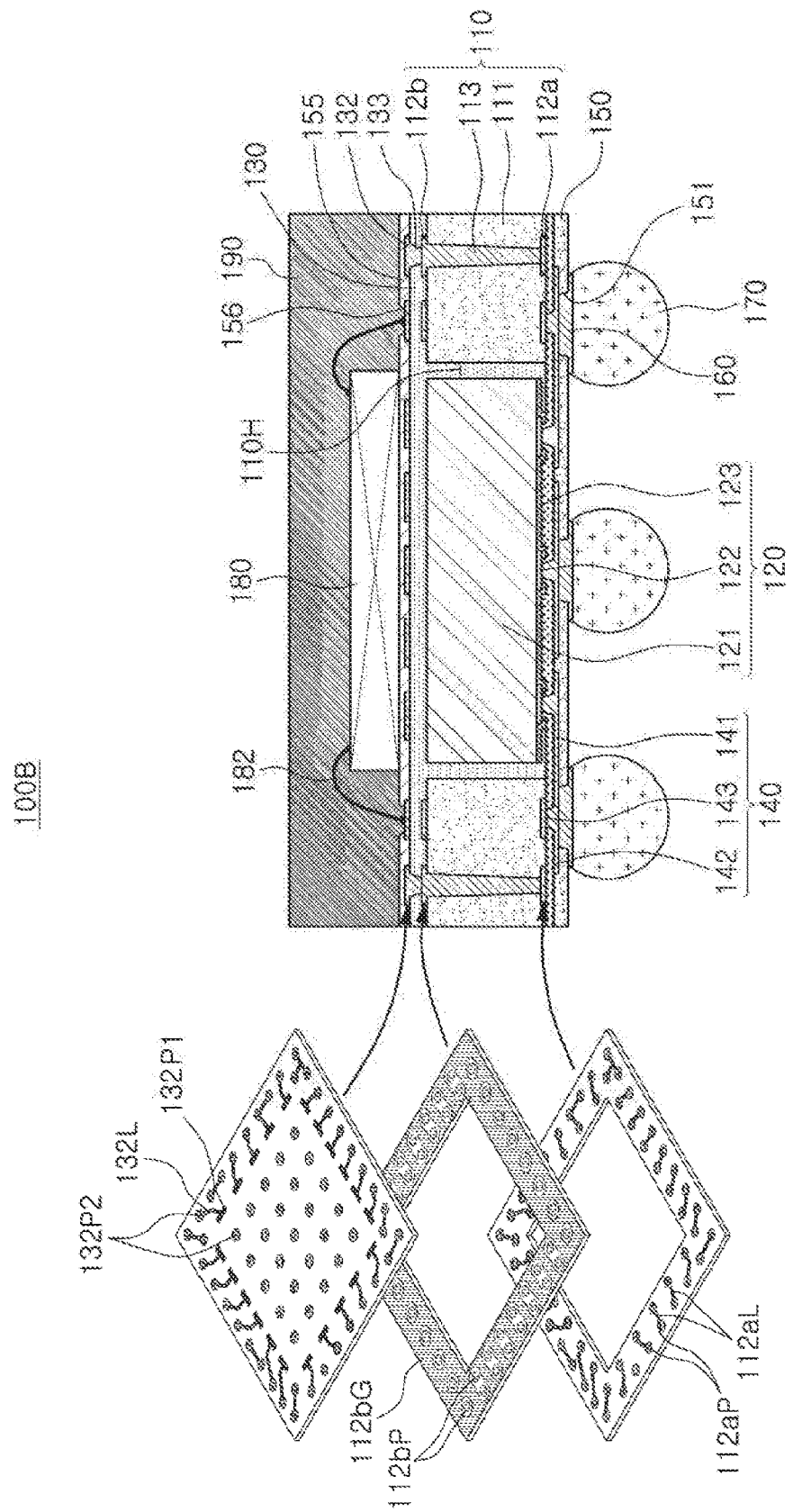
FIG. 10 is a schematic view illustrating another example of a fan-out semiconductor package.

FIG. 10 is a schematic view illustrating another example of a fan-out semiconductor package.

Referring to the drawing, a fan-out semiconductor package 100B according to another exemplary embodiment in the present disclosure may further include a backside redistribution layer 132 disposed on the first encapsulant 130, backside vias 133 penetrating through the first encapsulant 130 and electrically connecting the backside redistribution layer 132 and the redistribution layers 112a and 112b of the first interconnection member 110 to each other, and a passivation layer 155 disposed on the first encapsulant 130 and having openings 156 exposing at least portions of the backside redistribution layer 132. The second semiconductor chip 180 may be disposed on the passivation layer 155, and the wires 182 may be connected to the backside redistribution layer 132 exposed through the openings 156.

The backside redistribution layer 132 may serve to redistribute the connection pads 122 of the first semiconductor chip 120 and the connection pads (not illustrated) of the second semiconductor chip 180, and a conductive material such as copper (Cu), aluminum (Al), silver (Ag), tin (Sn), gold (Au), nickel (Ni), lead (Pb), titanium (Ti), or alloys thereof, may be used as a material of the backside redistribution layer 132. The backside redistribution layer 132 may perform various functions depending on a design thereof. For example, the backside redistribution layer 132 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the backside redistribution layer 132 may include via pads, wire pads, connection terminal pads, and the like.

As a non-restrictive example, the backside redistribution layer 132 may include wire pads 132P1 connected to the wires, and wiring patterns 132L and 132P2 such as signal, power, ground lines 132L or pads 132P2, or the like, connected to the wire pads 132P1 and at least redistributing the connection pads (not illustrated) of the second semiconductor chip 180. Meanwhile, the second redistribution layer 112b may include wiring patterns 112bP and 112bG such as signal, power, ground pads 112bP or plane 112bG, or the like, electrically connected to the backside redistribution layer 132 through the backside vias 133 and at least redistributing the connection pads (not illustrated) of the second semiconductor chip 180. In addition, the first redistribution layer 112a may include wiring patterns 112aL and 112aP such as signal, power, ground lines 112aL or pad 112aP, or the like, electrically connected to the second redistribution layer 112b through the vias 113 and at least redistributing the connection pads (not illustrated) of the second semiconductor chip 180. The connection pads 122 of the first semiconductor chip 120 may also be redistributed.

Portions of the backside redistribution layer 132 may be exposed through the openings 156 formed in the passivation layer 155, and the exposed backside redistribution layer 132 may be connected to the wires 182. That is, the exposed backside redistribution layer 132 may include the wire pads 132P1 connected to the wires. Meanwhile, a surface treatment layer (not illustrated) may be formed on a surface of the exposed backside redistribution layer 132, if necessary. The surface treatment layer (not illustrated) may be formed by, for example, electrolytic gold plating, electroless gold plating, OSP or electroless tin plating, electroless silver plating, electroless nickel plating/substituted gold plating, DIG plating, HASL, or the like.

Descriptions of configurations overlapping the previously described configuration will be omitted.

Figure 11:
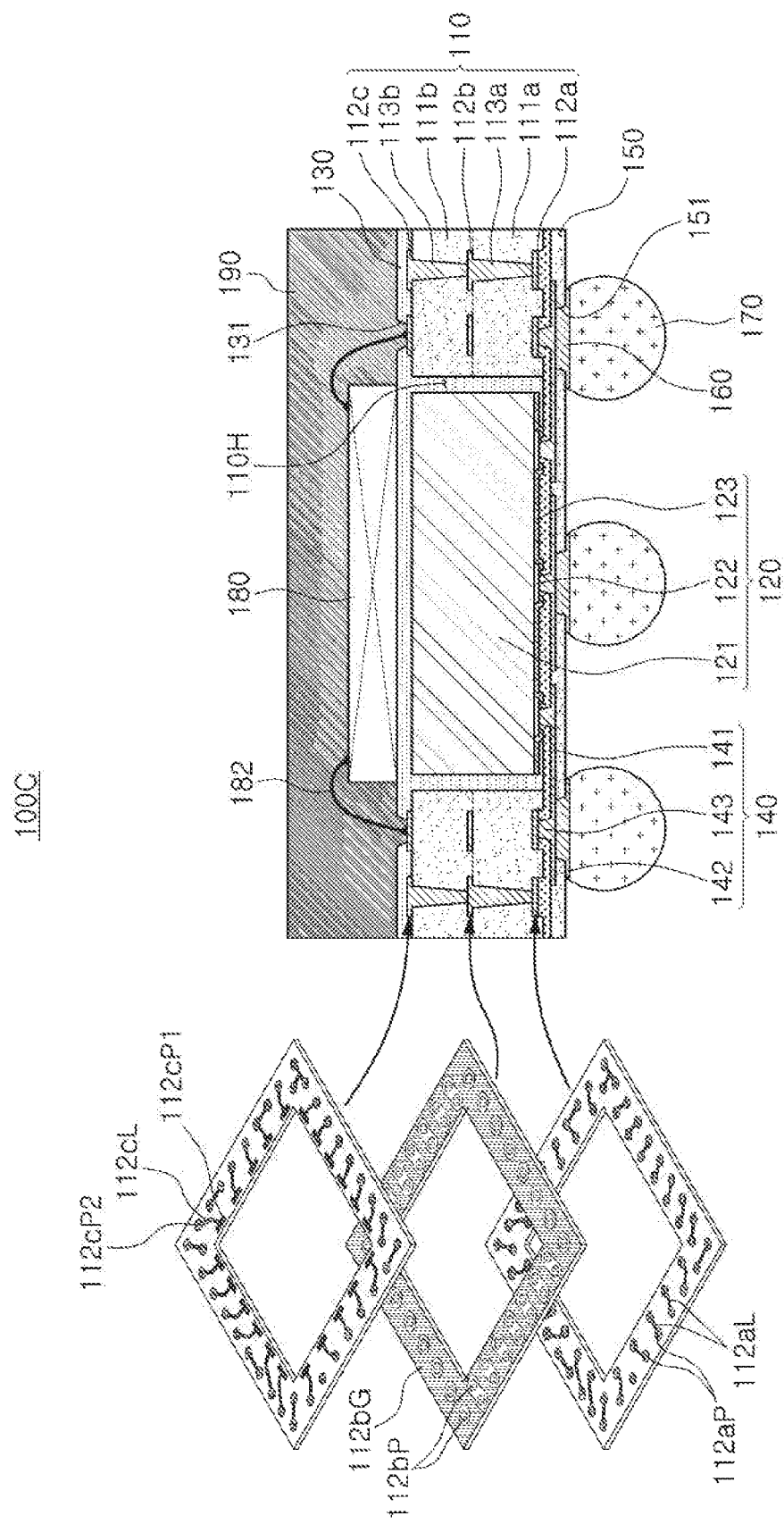
FIG. 11 is a schematic view illustrating another example of a fan-out semiconductor package.

FIG. 11 is a schematic view illustrating another example of a fan-out semiconductor package.

Referring to the drawing, in a fan-out semiconductor package 100C according to another exemplary embodiment in the present disclosure, a first interconnection member 110 may include a first insulating layer 111a contacting a second interconnection member 140, a first redistribution layer 112a contacting the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, the first and second redistribution layers 112a and 112b and the second and third redistribution layers 112b and 112c may be electrically connected to each other through first and second vias 113a and 113b penetrating through the first and second insulating layers 111a and 111b, respectively.

The redistribution layers 112a, 112b, and 112c may serve to redistribute the connection pads 122 of the first semiconductor chip 120 and the connection pads (not illustrated) of the second semiconductor chip 180, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a, 112b, and 112c. The redistribution layers 112a, 112b, and 112c may perform various functions depending on designs of corresponding layers. For example, the redistribution layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include via pads, wire pads, connection terminal pads, and the like.

As a non-restrictive example, the third redistribution layer 112c may include wire pads 112cP1 connected to the wires, and wiring patterns 112cL and 112cP2 such as signal, power, ground lines 112cL or pads 112cP2, or the like, connected to the wire pads 112cP1 and at least redistributing the connection pads (not illustrated) of the second semiconductor chip 180. In addition, the second redistribution layer 112b may include wiring patterns 112bP and 112bG such as signal, power, ground pads 112bP or plane 112bG, or the like, electrically connected to the third redistribution layer 112c through the second vias 113b and at least redistributing the connection pads (not illustrated) of the second semiconductor chip 180. In addition, the first redistribution layer 112a may include wiring patterns 112aL and 112aP such as signal, power, ground lines 112aL or pad 112aP, or the like, electrically connected to the second redistribution layer 112b through the first vias 113a and at least redistributing the connection pads (not illustrated) of the second semiconductor chip 180. The connection pads 122 of the first semiconductor chip 120 may also be redistributed.

Portions of the third redistribution layer 112c may be exposed through openings 131 formed in the first encapsulant 130, and the exposed third redistribution layer 112c may be connected to the wires 182. That is, the exposed third redistribution layer 112c may include the wire pads 112cP1 connected to the wires. Meanwhile, a surface treatment layer (not illustrated) may be formed on a surface of the exposed third redistribution layer 112c, if necessary. The surface treatment layer (not illustrated) is not particularly limited as long as it is known in the related art, and may be formed by using, for example, electrolytic gold plating, electroless gold plating, OSP or electroless tin plating, electroless silver plating, electroless nickel plating/substituted gold plating, DIG plating, HASL, or the like.

Since the first redistribution layer 112a is embedded in the first insulating layer 111a, an insulating distance of an insulating layer 141 of the second interconnection member 140 may be substantially constant, as described above. Since the first interconnection member 110 may include a large number of redistribution layers 112a, 112b, and 112c, the second interconnection member 140 may be simplified. Therefore, a decrease in yield depending on a defect occurring in a process of forming the second interconnection member 140 may be improved. The first redistribution layer 112a may be recessed in the first insulating layer 111a, such that a lower surface of the first insulating layer 111a may have a step with respect to a lower surface of the first redistribution layer 112a. Resultantly, when a first encapsulant 130 is formed, a phenomenon in which a material of the first encapsulant 130 is bled, polluting the first redistribution layer 112a, may be prevented.

The lower surface of the first redistribution layer 112a of the first interconnection member 110 may be disposed on a level higher than a lower surface of the connection pad 122 of the first semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pad 122 of the first semiconductor chip 120. The reason is that the first redistribution layer 112a may be recessed in the first insulating layer 111a. The second redistribution layer 112b of the first interconnection member 110 may be disposed on a level between an active surface and an inactive surface of the first semiconductor chip 120. The first interconnection member 110 may be formed at a thickness corresponding to that of the first semiconductor chip 120. Therefore, the second redistribution layer 112b formed in the first interconnection member 110 may be disposed on a level between the active surface and the inactive surface of the first semiconductor chip 120.

Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the first semiconductor chip 120, the redistribution layers 112a, 112b, and 112c may be formed to be relatively large, depending on a scale of the first interconnection member 110. On the other hand, the redistribution layer 142 of the second interconnection member 140 may be formed to be relatively small, for thinness.

Descriptions of configurations overlapping the previously described configuration will be omitted. Meanwhile, a description of the fan-out semiconductor package 100B may also be applied to the fan-out semiconductor package 100C.

Figure 12:
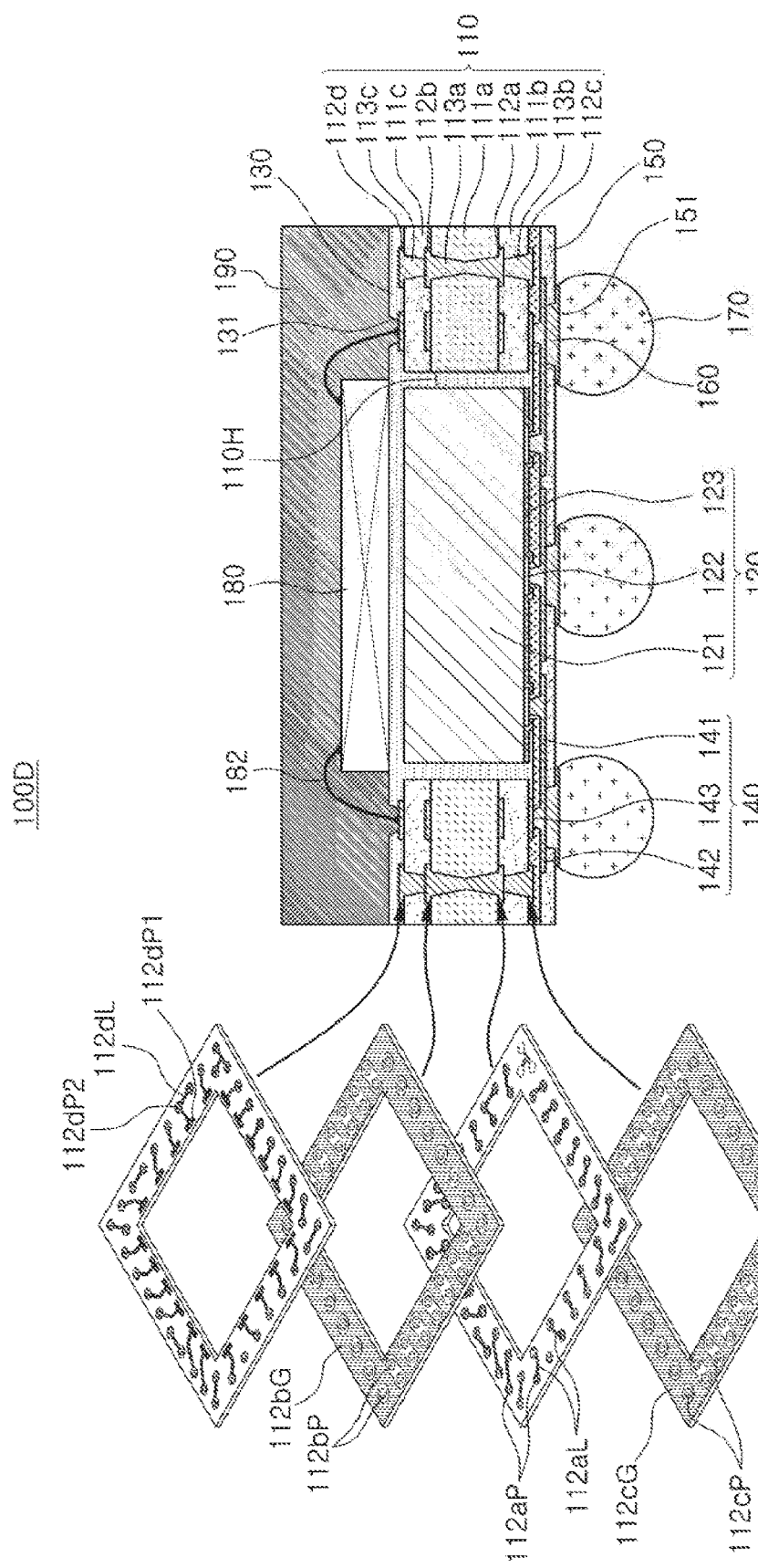
FIG. 12 is a schematic view illustrating another example of a fan-out semiconductor package.

FIG. 12 is a schematic view illustrating another example of a fan-out semiconductor package.

Referring to the drawing, in a fan-out semiconductor package 100D according to another exemplary embodiment in the present disclosure, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, the second interconnection member 140 may be further simplified. Therefore, a decrease in yield depending on a defect occurring in a process of forming the second interconnection member 140 may be improved. Meanwhile, the first to fourth redistribution layers 112a, 112b, 112c, and 112d may be electrically connected to each other through first to third vias 113a, 113b, and 113c each penetrating through the first to third insulating layers 111a, 111b, and 111c.

The redistribution layers 112a, 112b, 112c, and 112d may serve to redistribute the connection pads 122 of the first semiconductor chip 120 and the connection pads (not illustrated) of the second semiconductor chip 180, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a, 112b, 112c, and 112d. The redistribution layers 112a, 112b, 112c, and 112d may perform various functions depending on designs of their corresponding layers. For example, the redistribution layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, 112c, and 112d may include via pads, wire pads, connection terminal pads, and the like.

As a non-restrictive example, the fourth redistribution layer 112d may include wire pads 112dP1 connected to the wires, and wiring patterns 112dL and 112dP2 such as signal, power, ground lines 112dL or pads 112dP2, or the like, connected to the wire pads 112dP1 and at least redistributing the connection pads (not illustrated) of the second semiconductor chip 180. In addition, the second redistribution layer 112b may include wiring patterns 112bP and 112bG such as signal, power, ground pads 112bP or plane 112bG, or the like, electrically connected to the fourth redistribution layer 112d through the third vias 113c and at least redistributing the connection pads (not illustrated) of the second semiconductor chip 180. Further, the first redistribution layer 112a may include wiring patterns 112aL and 112aP such as signal, power, ground lines 112aL or pad 112aP, or the like, electrically connected to the second redistribution layer 112b through the first vias 113a and at least redistributing the connection pads (not illustrated) of the second semiconductor chip 180. Further, the third redistribution layer 112c may include wiring patterns 112cP and 112cG such as signal, power, ground pads 112cP or plane 112cG, or the like, electrically connected to the first redistribution layer 112a through the second vias 113b and at least redistributing the connection pads (not illustrated) of the second semiconductor chip 180. The connection pads 122 of the first semiconductor chip 120 may also be redistributed through these wiring patterns.

Portions of the fourth redistribution layer 112d may be exposed through openings 131 formed in the first encapsulant 130, and the exposed fourth redistribution layer 112d may be connected to the wires 182. That is, the exposed fourth redistribution layer 112d may include the wire pads 112dP1 connected to the wires. Meanwhile, a surface treatment layer (not illustrated) may be formed on a surface of the exposed fourth redistribution layer 112d, if necessary. The surface treatment layer (not illustrated) is not particularly limited as long as it is known in the related art, and may be formed by using, for example, electrolytic gold plating, electroless gold plating, OSP or electroless tin plating, electroless silver plating, electroless nickel plating/substituted gold plating, DIG plating, HASL, or the like.

The first insulating layer 111a may have a thickness greater than those of the second insulating layer 111b and the third insulating layer 111c. The first insulating layer 111a may basically be relatively thick in order to maintain rigidity, while the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pad 122 of the first semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pad 122 of the first semiconductor chip 120. The reason is that the third redistribution layer 112c may be disposed on the second insulating layer 111b in protruding form, resulting in contacting the second interconnection member 140. The first redistribution layer 112a and the second redistribution layer 112b of the first interconnection member 110 may be disposed on a level between an active surface and an inactive surface of the first semiconductor chip 120. The first interconnection member 110 may be formed at a thickness corresponding to that of the first semiconductor chip 120. Therefore, the first redistribution layer 112a and the second redistribution layer 112b formed in the first interconnection member 110 may be disposed on a level between the active surface and the inactive surface of the first semiconductor chip 120.

Thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the first semiconductor chip 120, the redistribution layers 112a, 112b, 112c, and 112d may also be formed to be relatively large. On the other hand, the redistribution layer 142 of the second interconnection member 140 may be formed to be relatively small, for thinness.

Descriptions of configurations overlapping the previously described configuration will be omitted. Meanwhile, a description of the fan-out semiconductor package 100B may also be applied to the fan-out semiconductor package 100D.

As set forth above, according to the exemplary embodiment in the present disclosure, a fan-out semiconductor package capable of simultaneously performing various functions, being thinned, and having low signal loss may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first interconnection member having a through-hole;
a first semiconductor chip disposed in the through-hole of the first interconnection member and having an active surface having connection pads disposed thereon and an inactive surface opposing the active surface;
a first encapsulant encapsulating at least portions of the first interconnection member and the inactive surface of the first semiconductor chip;
a second interconnection member disposed on the first interconnection member and the active surface of the first semiconductor chip;
a second semiconductor chip disposed on the first encapsulant and having an active surface having connection pads disposed thereon; and
a second encapsulant encapsulating at least portions of the second semiconductor chip,
wherein the first interconnection member and the second interconnection member include, respectively, redistribution layers electrically connected to the connection pads of the first semiconductor chip, and
the connection pads of the second semiconductor chip are electrically connected to the redistribution layer of the first interconnection member by wires.

2. The fan-out semiconductor package of claim 1, wherein the redistribution layer of the first interconnection member includes wire pads that the wires are connected to and wiring patterns redistributing the connection pads of the second semiconductor chip.

3. The fan-out semiconductor package of claim 2, wherein the first encapsulant has openings exposing at least portions of the wire pads of the redistribution layer of the first interconnection member.

4. The fan-out semiconductor package of claim 1, wherein the first semiconductor chip includes a processor chip, and the second semiconductor chip includes a memory chip.

5. The fan-out semiconductor package of claim 1, wherein the first interconnection member includes a first insulating layer, a first redistribution layer contacting the second interconnection member and embedded in a first surface of the first insulating layer, and a second redistribution layer disposed on a second surface of the first insulating layer opposing the first surface of the first insulating layer.

6. A fan-out semiconductor package comprising:
a first interconnection member having a through-hole;
a first semiconductor chip disposed in the through-hole of the first interconnection member and having an active surface having connection pads disposed thereon and an inactive surface opposing the active surface;
a first encapsulant encapsulating at least portions of the first interconnection member and the inactive surface of the first semiconductor chip;
a second interconnection member disposed on the first interconnection member and the active surface of the first semiconductor chip;
a second semiconductor chip disposed on the first encapsulant and having an active surface having connection pads disposed thereon; and
a second encapsulant encapsulating at least portions of the second semiconductor chip,
wherein the first interconnection member includes a first insulating layer, a first redistribution layer contacting the second interconnection member and embedded in a first surface of the first insulating layer, a second redistribution layer disposed on a second surface of the first insulating layer opposing the first surface of the first insulating layer, a second insulating layer disposed on the first insulating layer and covering the second redistribution layer, and a third redistribution layer disposed on the second insulating layer,
the first to third redistribution layers of the first interconnection member are electrically connected to the connection pads of the first semiconductor chip,
the second interconnection member includes a redistribution layer electrically connected to the connection pads of the first semiconductor chip,
the connection pads of the second semiconductor chip are electrically connected to the third redistribution layer of the first interconnection member.

7. A fan-out semiconductor package comprising:
a first interconnection member having a through-hole;
a first semiconductor chip disposed in the through-hole of the first interconnection member and having an active surface having connection pads disposed thereon and an inactive surface opposing the active surface;
a first encapsulant encapsulating at least portions of the first interconnection member and the inactive surface of the first semiconductor chip;
a second interconnection member disposed on the first interconnection member and the active surface of the first semiconductor chip;
a second semiconductor chip disposed on the first encapsulant and having an active surface having connection pads disposed thereon; and
a second encapsulant encapsulating at least portions of the second semiconductor chip,
wherein the first interconnection member includes a first insulating layer, a first redistribution layer contacting the second interconnection member and embedded in a first surface of the first insulating layer, and a second redistribution layer disposed on a second surface of the first insulating layer opposing the first surface of the first insulating layer,
the first and second redistribution layers of the first interconnection member are electrically connected to the connection pads of the first semiconductor chip,
the second interconnection member includes a redistribution layer electrically connected to the connection pads of the first semiconductor chip,
a distance between the redistribution layer of the second interconnection member and the first redistribution layer is greater than that between the redistribution layer of the second interconnection member and the connection pad of the first semiconductor chip, and
the connection pads of the second semiconductor chip are electrically connected to the second redistribution layer of the first interconnection member.

8. A fan-out semiconductor package comprising:
a first interconnection member having a through-hole;
a first semiconductor chip disposed in the through-hole of the first interconnection member and having an active surface having connection pads disposed thereon and an inactive surface opposing the active surface;
a first encapsulant encapsulating at least portions of the first interconnection member and the inactive surface of the first semiconductor chip;
a second interconnection member disposed on the first interconnection member and the active surface of the first semiconductor chip;
a second semiconductor chip disposed on the first encapsulant and having an active surface having connection pads disposed thereon; and
a second encapsulant encapsulating at least portions of the second semiconductor chip,
wherein the first interconnection member includes a first insulating layer, a first redistribution layer contacting the second interconnection member and embedded in a first surface of the first insulating layer, and a second redistribution layer disposed on a second surface of the first insulating layer opposing the first surface of the first insulating layer,
the first and second redistribution layers of the first interconnection member are electrically connected to the connection pads of the first semiconductor chip,
the second interconnection member includes a redistribution layer electrically connected to the connection pads of the first semiconductor chip,
the first redistribution layer has a thickness greater than that of the redistribution layer of the second interconnection member, and
the connection pads of the second semiconductor chip are electrically connected to the second redistribution layer of the first interconnection member.

9. The fan-out semiconductor package of claim 6, wherein the second redistribution layer is disposed on a level between the active surface and the inactive surface of the first semiconductor chip.

10. A fan-out semiconductor package comprising:
a first interconnection member having a through-hole;
a first semiconductor chip disposed in the through-hole of the first interconnection member and having an active surface having connection pads disposed thereon and an inactive surface opposing the active surface;
a first encapsulant encapsulating at least portions of the first interconnection member and the inactive surface of the first semiconductor chip;
a second interconnection member disposed on the first interconnection member and the active surface of the first semiconductor chip;
a second semiconductor chip disposed on the first encapsulant and having an active surface having connection pads disposed thereon; and a second encapsulant encapsulating at least portions of the second semiconductor chip, wherein the first interconnection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer, the first to third redistribution layers of the first interconnection member are electrically connected to the connection pads of the first semiconductor chip, the second interconnection member include a redistribution layer electrically connected to the connection pads of the first semiconductor chip, and the connection pads of the second semiconductor chip are electrically connected to the third redistribution layer of the first interconnection member.

11. The fan-out semiconductor package of claim 10, wherein the first interconnection member further includes a third insulating layer disposed on the first insulating layer and covering the second redistribution layer and a fourth redistribution layer disposed on the third insulating layer.

12. The fan-out semiconductor package of claim 10, wherein the first insulating layer has a thickness greater than that of the second insulating layer.

13. The fan-out semiconductor package of claim 10, wherein the third redistribution layer has a thickness greater than that of the redistribution layer of the second interconnection member.

14. The fan-out semiconductor package of claim 10, wherein the first redistribution layer is disposed on a level between the active surface and the inactive surface of the first semiconductor chip.

15. The fan-out semiconductor package of claim 1, wherein the redistribution layer of the first interconnection member includes wire pads connected to the wires and wiring patterns redistributing the connection pads of the second semiconductor chip.

* * * * *